(12) United States Patent
Hsu

(10) Patent No.: US 8,319,298 B2
(45) Date of Patent: Nov. 27, 2012

(54) INTEGRATED CIRCUIT MODULE

(75) Inventor: Hsiuan-Ju Hsu, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 556 days.

(21) Appl. No.: 12/701,684

(22) Filed: Feb. 8, 2010

(65) Prior Publication Data

US 2011/0127665 A1 Jun. 2, 2011

(51) Int. Cl.
*H01L 27/14* (2006.01)
(52) U.S. Cl. ............... 257/428; 257/693; 257/E23.069
(58) Field of Classification Search .............. 257/428, 257/693, E23.069
See application file for complete search history.

(56) References Cited

U.S. PATENT DOCUMENTS

| | | | |
|---|---|---|---|
| 6,770,955 B1 * | 8/2004 | Coccioli et al. | 257/659 |
| 6,946,726 B1 * | 9/2005 | Kuang | 257/693 |
| 7,470,977 B2 * | 12/2008 | Okubora | 257/660 |
| 8,232,621 B2 * | 7/2012 | Yamazaki et al. | 257/531 |
| 2004/0099940 A1 * | 5/2004 | Standing | 257/693 |
| 2005/0093145 A1 * | 5/2005 | Briancon et al. | 257/724 |
| 2007/0122960 A1 * | 5/2007 | Aoki | 438/197 |
| 2007/0200146 A1 * | 8/2007 | Onishi et al. | 257/202 |
| 2007/0228548 A1 * | 10/2007 | Kuang | 257/693 |
| 2008/0217760 A1 * | 9/2008 | Yoshihara et al. | 257/693 |
| 2009/0091018 A1 * | 4/2009 | Maeda et al. | 257/693 |
| 2011/0062549 A1 * | 3/2011 | Lin | 257/531 |
| 2011/0068433 A1 * | 3/2011 | Kim et al. | 257/531 |

OTHER PUBLICATIONS

Rogier, H "Design of an on-package slot antenna for bluetooth applications" Conf. on Elec. Perf. of Elec. Pack. 2000 IEEE Oct. 25, 2000 pp. 292-295.*

* cited by examiner

*Primary Examiner* — N Drew Richards
*Assistant Examiner* — Grant Withers
(74) *Attorney, Agent, or Firm* — Altis Law Group, Inc.

(57) ABSTRACT

An integrated circuit module includes a carrier substrate, a semiconductor die disposed in the carrier substrate, a ground pad disposed on the carrier substrate, and an antenna partially embedded in the carrier substrate. The antenna includes a ground layer in thermal contact with the ground pad for dissipating heat generated from the semiconductor die.

15 Claims, 3 Drawing Sheets

INTEGRATED CIRCUIT MODULE

BACKGROUND

1. Technical Field

The present disclosure relates to an integrated circuit module with an antenna.

2. Description of Related Art

In electronics, an integrated circuit (also known as IC, microcircuit, microchip, silicon chip, or chip) is a miniaturized electronic circuit (consisting mainly of semiconductor devices, as well as passive components) that has been manufactured on the surface of a thin substrate of semiconductor material. Integrated circuits are used in almost all electronic equipment in use today and have revolutionized the world of electronics.

Recently, in mobile devices, such as mobile phones and Personal Digital Assistants (PDAs), technology for System-in-Package (SiP), in which various systems and passive devices are implemented in the form of a single package to realize the small size of the mobile devices, and in which an antenna for data transmission/reception is also integrated in the package, has been widely used.

Referring to FIG. 3, a conventional SiP integrated circuit, according to the prior art, includes an antenna 2 embedded in an integrated circuit (IC) package 1. The integrated circuit can receive or transmit communication signals via the antenna 2. However, the antenna 2 integrated in the IC package 1 may cause signal interference and heat transfer deterioration in the integrated circuit.

What is needed, therefore, is an integrated circuit module integrated with an antenna capable of decreasing signal interference and dissipating heat from the integrated circuit module.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean at least one.

Figure 1:
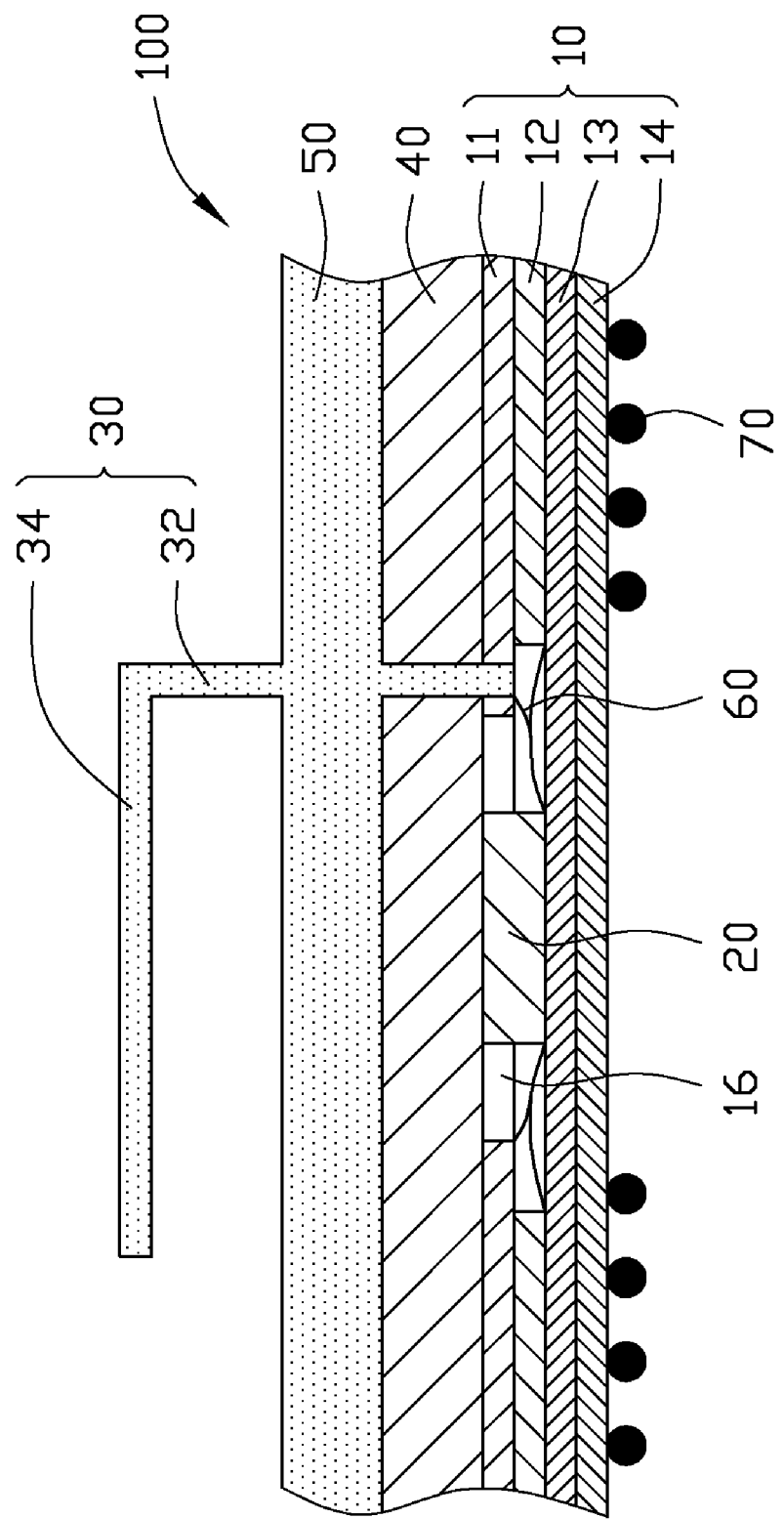
FIG. 1 is a cross-sectional view of an integrated circuit module in accordance with an embodiment.

Referring to FIG. 1, an embodiment of an integrated circuit (IC) module 100 includes a carrier substrate 10, a semiconductor die 20 mounted in the carrier substrate 10, and an antenna 30 partially embedded in the carrier substrate 10. The semiconductor die 20 has a plurality of semiconductor elements integrated together for implementing major functions of the IC module 100. The carrier substrate 10 includes a plurality of package layers 11, 12, 13, 14. Each of the package layers 11, 12, 13, 14 includes conductive traces and via-holes (not shown) that electrically connect to the semiconductor die 20. The package layers 11, 12, 13, 14 provide electrical connections between the semiconductor die 20 and an external circuit. A plurality of solder balls 70 is attached to a bottom surface of the carrier substrate 10 for electrically connecting the IC module 100 to a printed circuit board (PCB).

A cavity 16 is defined in a central portion of the carrier substrate 10 for receiving the semiconductor die 20 therein. A top surface of the semiconductor die 20 lies in the same plane as that of the carrier substrate 10.

The IC module 100 further includes a ground pad 40 disposed on the top surface of the carrier substrate 10 and the semiconductor die 20. The ground pad 40 provides shielding to the semiconductor die 20 from radiation emitting from the antenna 30. The antenna 30 includes an L-shaped main body and a ground layer 50 disposed on the ground pad 40.

The L-shaped main body of the antenna 30 includes a support lever 32 perpendicular to the ground layer 50 and a planar portion 34 extending perpendicularly from a top edge of the support lever 32 for receiving communication signals. A lower end of the support lever 32 of the antenna 30 extends through the ground pad 40 and extends into the carrier substrate 10. The antenna 30 is connected to the semiconductor die 20 via a plurality of bonding wires 60 and capable of communicating with the semiconductor die 20.

In the embodiment, the antenna 30 is made of heat conductive material (such as metal) and integrally formed. The ground layer 50 of the antenna 30 can partially or fully contact the ground pad 40 for facilitating heat dissipation for the semiconductor die 20.

Figure 2:
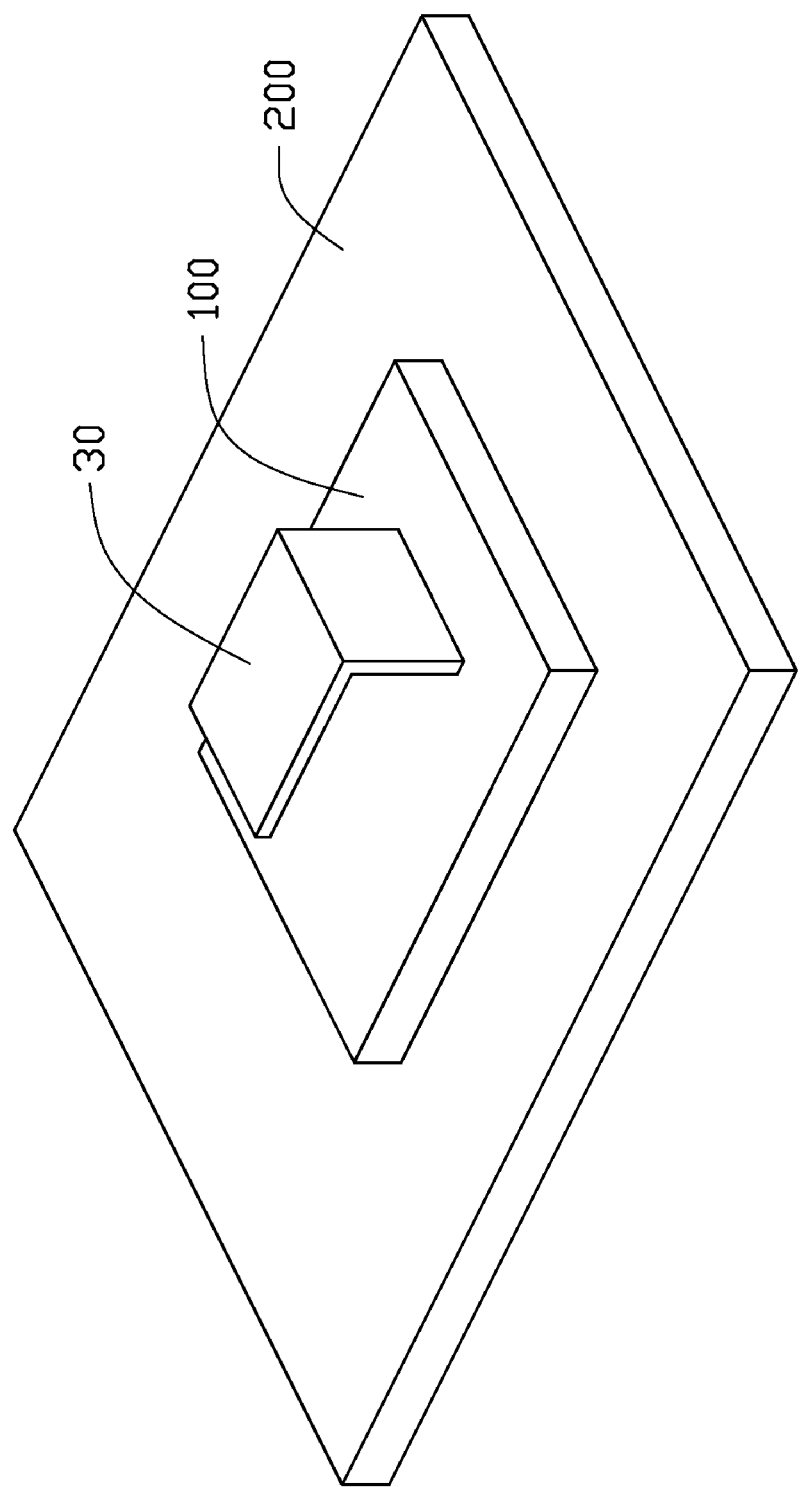
FIG. 2 illustrates the integrated circuit module of the present disclosure being attached on a circuit board.
Figure 3:
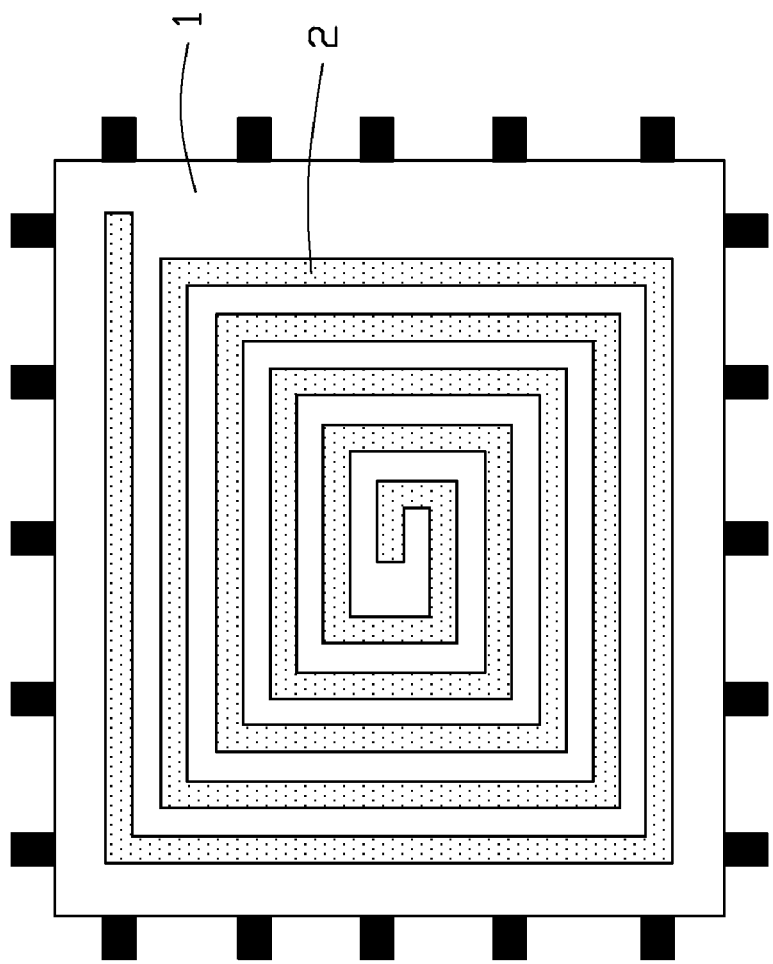
FIG. 3 is a view of a system-in-package integrated circuit according to the prior art.

Referring to FIG. 2, the IC module 100 is attached on a circuit board 200. The circuit board 200 is configured to be attached in a portable electronic device (such as a cell phone). The antenna 30 is partially extended out from the electronic device for receiving communication signals and capable of conducting the heat generated by the IC module 100 out from the electronic device, thereby preventing the semiconductor die 20 from overheating. Thus the antenna 30 performs two functions simultaneously.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art. Therefore, the present disclosure is not limited to the specific details and illustrative examples shown and described.

What is claimed is:

1. An integrated circuit module comprising:
   a carrier substrate having an upper surface and a lower surface, the lower surface having a plurality of solder balls for electrically connecting to an external circuit;
   a semiconductor die disposed in the carrier substrate;
   a ground pad disposed on the upper surface that provides shielding to the semiconductor die; and
   an antenna attached to the carrier substrate, wherein the antenna is capable of transmitting or receiving communication signals and comprises a ground layer in thermal contact with the ground pad for dissipating heat generated from the integrated circuit module.

2. The integrated circuit module of claim 1, wherein the antenna further comprises an L-shaped main body that is connected to the ground layer.

3. The integrated circuit module of claim 2, wherein the main body of the antenna comprises a support level that is perpendicular to the ground layer and a planar portion that extends perpendicularly from a top end of the support lever.

4. The integrated circuit module of claim 3, wherein a lower end of the support lever extends through the ground pad and extends into the carrier substrate.

5. The integrated circuit module of claim 1, wherein a top surface of the semiconductor die lies in the same plane as that of the carrier substrate.

6. The integrated circuit module of claim 1, wherein the carrier substrate comprises a plurality of package layers that provides connections between the semiconductor die and the external circuit.

7. The integrated circuit module of claim 1, wherein a cavity is defined in a central portion of the carrier substrate and receives the semiconductor die therein.

8. The integrated circuit module of claim 1, wherein a lower end of the antenna is extended into the carrier substrate and connected with the semiconductor die via wire bonds.

9. An integrated circuit module comprising:
- a carrier substrate with a cavity defined therein;
- a semiconductor die mounted in the cavity of the carrier substrate;
- a ground pad disposed on the carrier substrate and the semiconductor die; and
- an antenna that is in communication with the semiconductor die, in contact with the ground pad, capable of conducting heat generated from the integrated circuit module, and extends into the carrier substrate.

10. The integrated circuit module of claim 9, wherein the antenna further comprises a main body that is capable of receiving and transmitting signals, and a ground layer that is connected to the main body; the ground layer is in thermal contact with the ground pad.

11. The integrated circuit module of claim 10, wherein the antenna is formed of a single piece of heat-conductive material.

12. The integrated circuit module of claim 10, wherein an area of the ground layer of the antenna is same as that of the ground pad.

13. The integrated circuit module of claim 10, wherein the main body of the antenna comprises a support level that is perpendicular to the ground layer and a planar portion that extends perpendicularly from a top end of the support lever.

14. The integrated circuit module of claim 13, wherein a lower end of the support level extends through the ground pad and partially extended into the carrier substrate.

15. The integrated circuit module of claim 9, wherein the carrier substrate comprises a plurality of package layers that provides connections between the semiconductor die and an external circuit.

* * * * *

UNITED STATES PATENT AND TRADEMARK OFFICE
CERTIFICATE OF CORRECTION

PATENT NO. : 8,319,298 B2  Page 1 of 1
APPLICATION NO. : 12/701684
DATED : November 27, 2012
INVENTOR(S) : Hsiuan-Ju Hsu It is certified that error appears in the above-identified patent and that said Letters Patent is hereby corrected as shown below:

Title Page, below Item (65) insert

-- (30)   Foreign Application Priority Data

Nov. 30 2009   (CN) .......................2009 2 0316151 --

Signed and Sealed this
Thirty-first Day of December, 2013

Margaret A. Focarino
*Commissioner for Patents of the United States Patent and Trademark Office*